(12) United States Patent
Maeda et al.

(10) Patent No.: US 8,658,905 B2
(45) Date of Patent: Feb. 25, 2014

(54) MULTILAYER WIRING SUBSTRATE

(75) Inventors: Shinnosuke Maeda, Nagoya (JP); Tatsuya Ito, Kakamiganhara (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 152 days.

(21) Appl. No.: 13/070,094

(22) Filed: Mar. 23, 2011

(65) Prior Publication Data

US 2011/0232951 A1    Sep. 29, 2011

(30) Foreign Application Priority Data

Mar. 26, 2010 (JP) .................................. 2010-73436

(51) Int. Cl.
*H05K 1/03* (2006.01)

(52) U.S. Cl.
USPC ............................ 174/255; 174/260; 174/262

(58) Field of Classification Search
USPC ......................................................... 174/250
See application file for complete search history.

(56) References Cited

U.S. PATENT DOCUMENTS

| | | | |
|---|---|---|---|
| 7,030,496 B2 | 4/2006 | Shinyama et al. | |
| 7,992,291 B2 | 8/2011 | Jung et al. | |
| 8,143,531 B2* | 3/2012 | Miki et al. ................... | 174/260 |
| 2005/0006778 A1 | 1/2005 | Shinyama et al. | |
| 2006/0270211 A1 | 11/2006 | Nakamura et al. | |
| 2008/0101045 A1* | 5/2008 | Jung et al. .................... | 361/761 |
| 2008/0308308 A1 | 12/2008 | Kobayashi | |
| 2009/0053459 A1* | 2/2009 | Hirose et al. ................... | 428/76 |
| 2009/0145635 A1 | 6/2009 | Shimizu | |
| 2009/0229874 A1* | 9/2009 | Katagiri et al. ............... | 174/262 |
| 2010/0084175 A1* | 4/2010 | Suzuki et al. ................. | 174/260 |
| 2010/0096171 A1* | 4/2010 | Lee et al. ...................... | 174/257 |
| 2010/0101852 A1* | 4/2010 | Shirai et al. ................... | 174/263 |
| 2010/0122839 A1* | 5/2010 | Akai et al. ..................... | 174/257 |
| 2010/0132997 A1* | 6/2010 | Hando .......................... | 174/262 |
| 2010/0139962 A1* | 6/2010 | Kaneko ......................... | 174/260 |
| 2011/0259627 A1 | 10/2011 | Jung et al. | |

FOREIGN PATENT DOCUMENTS

| | | |
|---|---|---|
| JP | H09-298252 A | 11/1997 |
| JP | 2002-368397 A | 12/2002 |
| JP | 2005-033131 A | 2/2005 |
| JP | 2008-112995 A | 5/2008 |

(Continued)

OTHER PUBLICATIONS

JPO, Office Action issued in corresponding Japanese application 2010-073436, issued Apr. 23, 2013.

*Primary Examiner* — Ishwarbhai B Patel
(74) *Attorney, Agent, or Firm* — Stites & Harbison PLLC; Jeffrey A. Haeberlin; Nicolo Davidson

(57) ABSTRACT

In a wiring laminate portion of a multilayer wiring substrate, a solder resist layer having a plurality of openings is disposed on a main surface side of the laminate structure, and connection terminals are embedded in an outermost resin insulation layer in contact with the solder resist layer. Each of the connection terminals comprises a copper layer and a metallic layer formed of at least one type of metal other than copper. A main-surface-side circumferential portion of the copper layer is covered by the solder resist layer. At least a portion of the metallic layer is located in a recess in a main-surface-side central portion of the copper layer. At least a portion of the metallic layer is exposed via a corresponding opening.

7 Claims, 7 Drawing Sheets

(56) References Cited  * cited by examiner

FOREIGN PATENT DOCUMENTS

| | | |
|---|---|---|
| JP | 4146864 | 6/2008 |
| JP | 2008-251702 A | 10/2008 |
| JP | 2009-141121 A | 6/2009 |

MULTILAYER WIRING SUBSTRATE

CROSS REFERENCE TO RELATED APPLICATIONS

The present application claims priority from Japanese Patent Application No. 2010-73436, which was filed on Mar. 26, 2010, the disclosure of which is herein incorporated by reference in its entirety.

BACKGROUND OF THE INVENTION

1. Field of the Invention

The present invention relates to a multilayer wiring substrate having a laminate structure in which a plurality of resin insulation layers made primarily of the same resin insulation material, and a plurality of conductive layers are laminated alternately in multilayer arrangement, and not having a so-called substrate core in a final product, the substrate core carrying build-up layers successively formed on opposite surfaces thereof.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate or the like) formed by impregnating reinforcement fiber with resin. Through utilization of rigidity of the substrate core, resin insulation layers and conductive layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed (refer to, for example, Patent Documents 1 and 2). The multilayer wiring substrates described in Patent Documents 1 and 2 do not use a substrate core, which is relatively thick, thereby reducing the overall wiring length. Thus, the transmission loss of high-frequency signals is lowered, whereby a semiconductor integrated circuit device can be operated at high speed.

RELATED ART DOCUMENTS

Patent Documents

Patent Document 1 is Japanese Patent No. 4146864 (FIGS. 1, 4, etc.). Patent Document 2 is Japanese Patent Application Laid-open (kokai) No. 2009-141121 (FIG. 7, etc.)

BRIEF SUMMARY OF THE INVENTION

Incidentally, in the above-described conventional wiring substrate, two plating layers; i.e., a nickel plating layer $109a$ and a gold plating layer $109b$, are formed on each connection terminal 108 in this sequence as viewed from the inner layer side (see FIG. 16). When a bump of solder 110 is formed on the connection terminal 108, gold which is present on the surface layer side of the connection terminal 108 diffuses into the molten solder 110, and a clearance is formed between a terminal outer surface $108a$ of the connection terminal 108 and a solder resist layer 105 along the circumference of the terminal outer surface $108a$. In such a case, since the solder resist layer 105 and the connection terminal 108 do not adhere together, the adhesion strength of the connection terminal 108 drops. Accordingly, in such a case, it becomes difficult to manufacture a wiring substrate of high reliability.

The present invention has been conceived in view of the above problems, and an object of the invention is to provide a highly reliable multilayer wiring substrate in which connection terminals have sufficiently enhanced adhesion strength.

A means (Means 1) for solving the above problems is a multilayer wiring substrate having a laminate structure in which a plurality of resin insulation layers made primarily of the same resin insulation material, and a plurality of conductive layers are laminated alternately in multilayer arrangement, a plurality of first-main-surface-side connection terminals being disposed on one side of the laminate structure where a first main surface thereof is present (i.e., on a first main surface side of the laminate structure), a plurality of second-main-surface-side connection terminals being disposed on the other side of the laminate structure where a second main surface thereof is present (i.e., on a second main surface side of the laminate structure), the plurality of conductive layers being formed in the plurality of resin insulation layers and interconnected by means of via conductors whose diameters increase toward the first main surface side or the second main surface side. In the multilayer wiring substrate, a solder resist layer having a plurality of openings is disposed on the first main surface side or the second main surface side of the laminate structure; each of the plurality of first-main-surface-side connection terminals or the plurality of second-main-surface-side connection terminals comprises a copper layer, and a metallic layer (e.g. a plating layer) formed of at least one type of metal other than copper, and is embedded (i.e., buried) in an outermost resin insulation layer in contact with the solder resist layer; a main-surface-side circumferential portion of the copper layer is covered by the solder resist layer; at least a portion of the metallic layer is located (i.e., buried) in a recess in (i.e., present at) a main-surface-side central portion of the copper layer; and at least a portion of the metallic layer is exposed via a corresponding opening of the plurality of openings. Preferably, the copper layer of each of the plurality of first-main-surface-side connection terminals or the plurality of second-main-surface-side connection terminals mainly constitutes the terminal.

According to the invention described in Means 1, the multilayer wiring substrate is formed such that a plurality of resin insulation layers made primarily of the same resin insulation material, and a plurality of conductive layers are laminated alternately, and assumes the form of a coreless wiring substrate having no substrate core. In this multilayer wiring substrate, a solder resist layer having a plurality of openings is disposed on the first main surface side or the second main surface side of the laminate structure, and a main-surface-side circumferential portion of the copper layer which mainly forms the first-main-surface-side connection terminal or the second-main-surface-side connection terminal is covered by the solder resist layer. In this case, unlike conventional multilayer wiring substrates, since no gold plating layer is present at the boundary between the solder resist layer and the copper layer, a clearance is not formed between the solder resist layer and a circumferential portion of the outer surface of each terminal during solder connection. Therefore, the adhesion strength of the connection terminals can be increased sufficiently. Furthermore, since the metallic layer is provided such that at least a portion of the metallic layer is located (buried) in the recess present at the main-surface-side central portion of the copper layer, the thickness of the connection terminals can be reduced.

Preferably, a conductive layer present at the interface between the solder resist layer and an outermost resin insulation layer is embedded (i.e., buried) in the outermost resin insulation layer. In this case, the conductive layer is present at the same interface as the plurality of first-main-surface-side connection terminals or the plurality of second-main-surface-side connection terminals. Since the conductive layer is embedded (i.e., buried) in the outermost resin insulation layer as in the case of the connection terminals, a sufficient degree of insulation can be secured between conductive layers, such as wiring patterns, and between the conductive layers and the connection terminals. Accordingly, since wiring traces can be provided at a relatively narrow pitch, the degree of integration of the multilayer wiring substrate can be increased.

Preferably, the recess present at the main-surface-side central portion of the copper layer is formed such that it is narrow at an inlet and becomes wider at an inside thereof. In this case, the area of contact between the copper layer and the metallic layer can be increased, whereby the metallic layer can be provided with a sufficient degree of strength.

Preferably, the metallic layer includes a nickel layer and a gold layer. The nickel layer and the gold layer which constitute the metallic layer are formed by means of, for example, electroplating or electroless plating. The metallic layer may include a palladium layer provided between the nickel plating layer and the gold plating layer. When the metallic layer is formed in this manner, solder connection of the connection terminals can be performed reliably.

The solder resist layer may be disposed on the first main surface side of the laminate structure, and, on the first main surface side, two types of connection terminals (i.e., IC-chip connection terminals to which an IC chip is to be connected and passive-component connection terminals to which a passive component is to be connected and which is greater in area than the IC-chip connection terminals) may be present as the plurality of first-main-surface-side connection terminals. In this case, the adhesion between the solder resist layer and the IC-chip connection terminals and the passive-component connection terminals can be enhanced sufficiently. Also, the thickness of the IC-chip connection terminals and the passive-component connection terminals can be reduced. Notably, the solder resist layer may be provided on the side opposite the first main surface side where the IC chip is mounted; specifically, on the second main surface side to which a motherboard is connected.

The via conductors formed in the plurality of resin insulation layers may be shaped such that their diameters increase in a direction from the first main surface side toward the second main surface side. By contrast, the via conductors formed in the plurality of resin insulation layers may also be shaped such that their diameters increase in a direction from the second main surface toward the first main surface. Through employment of this diametral feature, a coreless wiring substrate having no substrate core can be reliably manufactured.

Preferred examples of a polymeric material used to form the plurality of resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin. Notably, in the present invention, "a plurality of resin insulation layers made primarily of the same resin insulation material" may be a plurality of resin insulation layers which differ in additive, such as the above-mentioned organic fiber, which is mixed with, for example, thermo setting resin, if the resin insulation layers are mainly formed of the same thermo setting resin. Also, "solder resist layer" refers to a "resist layer" which is formed of a heat-resistant covering material and which prevents adhesion of solder to a portion covered by the resist layer during a soldering process.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

First Embodiment

Figure 1:
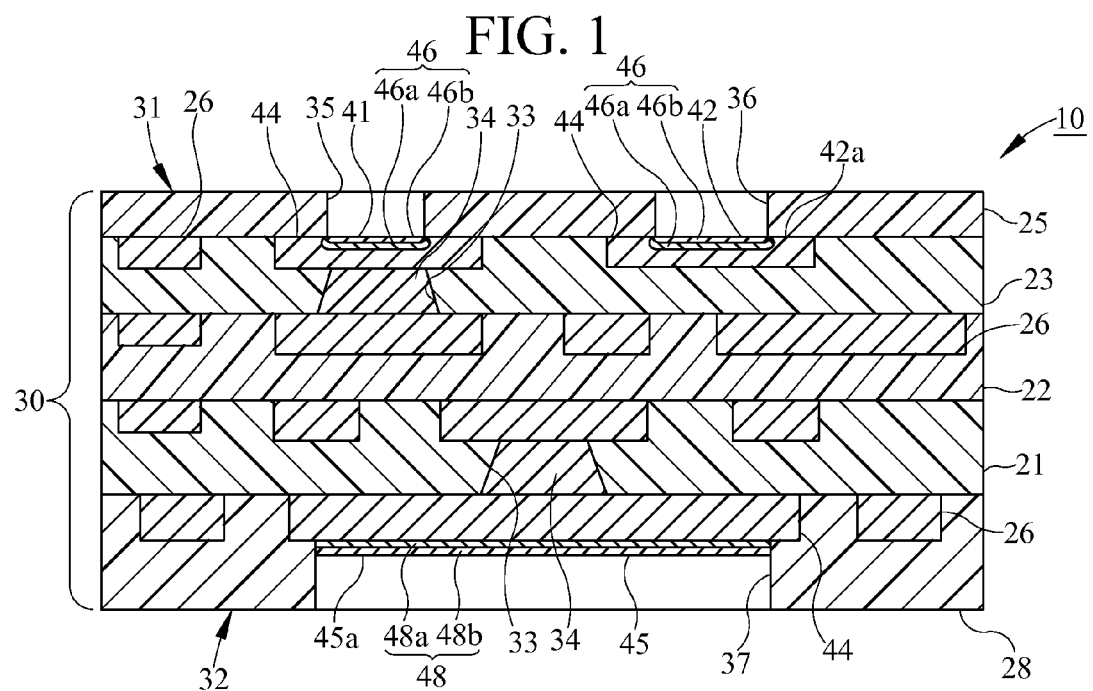
FIG. 1 is an enlarged sectional view schematically showing the structure of a multilayer wiring substrate according to a first embodiment.
Figure 2:
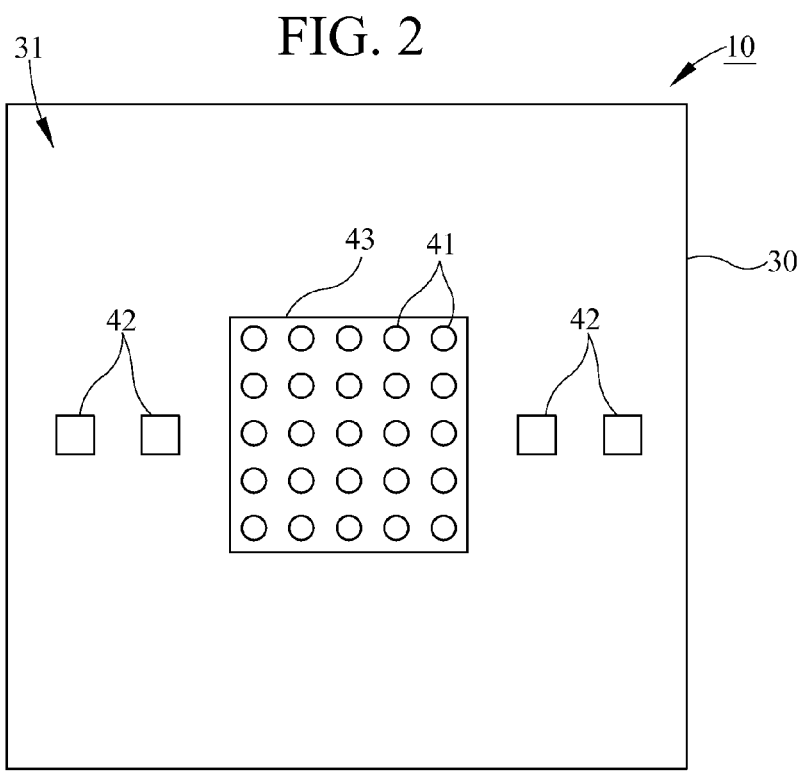
FIG. 2 is a plan view schematically showing the structure of the multilayer wiring substrate according to the first embodiment.
Figure 3:
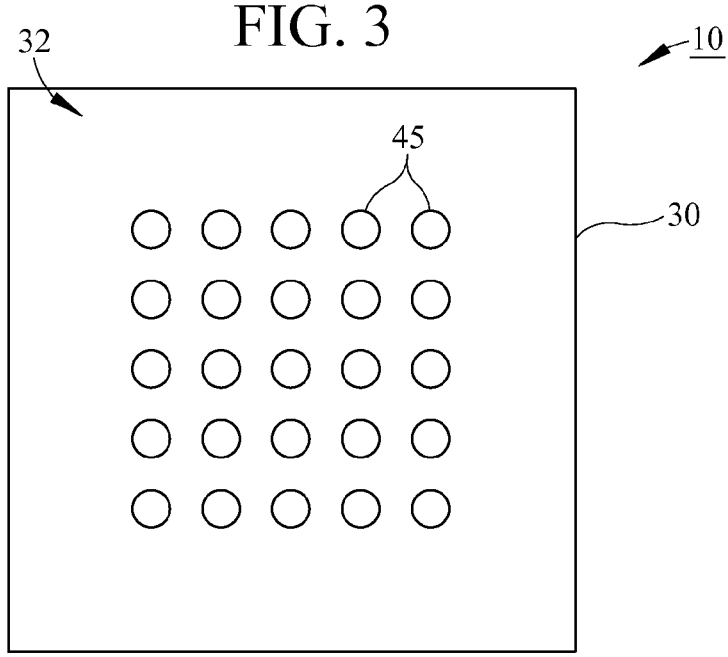
FIG. 3 is a plan view schematically showing the structure of the multilayer wiring substrate according to the first embodiment.

A multilayer wiring substrate according to a first embodiment of the present invention will next be described in detail with reference to the drawings. FIG. 1 is an enlarged sectional view schematically showing the structure of the multilayer wiring substrate of the present embodiment. FIG. 2 is a plan view of the multilayer wiring substrate as viewed from the top surface side. FIG. 3 is a plan view of the multilayer wiring substrate as viewed from the bottom surface side.

As shown in FIG. 1, a multilayer wiring substrate 10 is a coreless wiring substrate having no substrate core and has a multilayer wiring laminate portion 30 (laminate structure) in which a plurality of resin insulation layers 21, 22, and 23 made primarily of the same resin insulation material, and a plurality of conductive layers 26 made of copper are laminated alternately. The resin insulation layers 21 to 23 are formed of a build-up material made primarily of a hardened resin insulation material that is not photocurable; specifically, a hardened thermosetting epoxy resin. In the multilayer wiring substrate 10, a plurality of connection terminals 41 and 42 (first-main-surface-side connection terminals) are disposed on one side (first main surface side) of the wiring laminate portion 30 where a top surface 31 thereof is present.

As shown in FIGS. 1 and 2, in the multilayer wiring substrate 10 of the present embodiment, the plurality of connection terminals 41 and 42 disposed on the top surface 31 side of the wiring laminate portion 30 are IC-chip connection terminals 41 to which an IC chip is connected, and capacitor connection terminals 42 to which chip capacitors are connected. On the top surface 31 side of the wiring laminate portion 30, the plurality of IC-chip connection terminals 41 are arrayed in a chip mounting region 43 provided at a central portion of the multilayer wiring substrate 10. The capacitor connection terminals 42 are greater in area than the IC-chip connection terminals 41 and are disposed externally of the chip mounting region 43.

Meanwhile, as shown in FIGS. 1 and 3, on the other side (second main surface side) of the wiring laminate portion 30 where a bottom surface 32 thereof is present, a plurality of connection terminals 45 (motherboard connection terminals serving as second-main-surface-side connection terminals) for LGA (land grid array) to which a motherboard is connected are arrayed. The motherboard connection terminals 45 are greater in area than the IC-chip connection terminals 41 and the capacitor connection terminals 42 on the top surface 31 side.

Via holes 33 and filled-via conductors 34 are provided in the resin insulation layers 21, 22, and 23. The via conductors 34 are shaped such that their diameters increase in the same direction (in FIG. 1, in the direction from the top surface toward the bottom surface). The via conductors 34 electrically interconnect the conductive layers 26, the IC-chip connection terminals 41, the capacitor connection terminals 42, and the motherboard connection terminals 45.

On the top surface 31 side of the wiring laminate portion 30, the surface of the outermost resin insulation layer 23 is covered substantially completely by a solder resist layer 25. The solder resist layer 25 has a plurality of openings 35 and 36 formed therein so as to expose the IC-chip connection terminals 41 and the capacitor connection terminals 42. The solder resist layer 25 of the present embodiment is a resin insulation layer which is formed of the same resin insulation material as that constituting the resin insulation layers 21 to 23; specifically, a build-up material made primarily of a hardened thermosetting epoxy resin.

Figure 4:
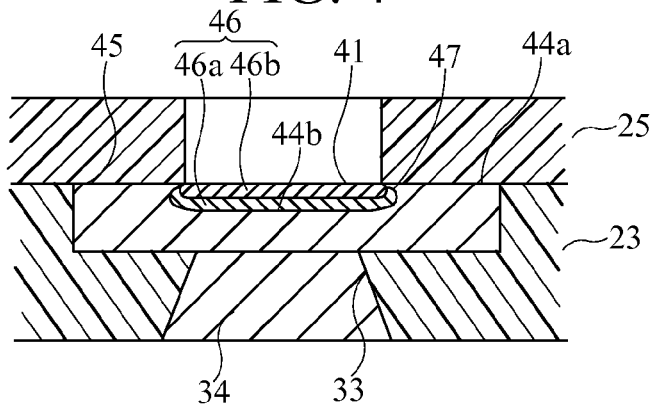
FIG. 4 is an enlarged sectional view showing the structure of an IC-chip connection terminal according to the first embodiment.

As shown in FIGS. 1 and 4, each of the IC-chip connection terminals 41 is composed of a copper layer 44 (main body) and a plating layer 46 formed of a metal other than copper (specifically, a metallic layer composed of a nickel plating layer 46a and a gold plating layer 46b). Each of the capacitor connection terminals 42 is also composed of a copper layer 44 (main body) and a plating layer 46 formed of a metal other than copper (a metallic layer composed of a nickel plating layer 46a and a gold plating layer 46b). Notably, the nickel plating layer 46a, which partially constitutes the plating layer 46, has a thickness of about 8 μm, and the gold plating layer 46b, which partially constitutes the plating layer 46, has a thickness of about 0.1 μm. The copper layer 44 has a thickness of about 25 μm.

The IC-chip connection terminals 41 and the capacitor connection terminals 42 are embedded (buried) in the outermost resin insulation layer 23 in contact with the solder resist layer 25, and a main-surface-side circumferential portion 44a of the copper layer 44 of each terminal is covered by the solder resist layer 25. Each of the IC-chip connection terminals 41 and the capacitor connection terminals 42 is configured such that a recess 47 (i.e., a recessed portion) is formed at a main-surface-side central portion 44b of the copper layer 44, and the plating layer 46 is located, embedded, or buried in the recess 47. The recess 47 is formed such that it is narrow at the inlet and becomes wider at the inside thereof (see FIG. 4). The plating layer 46 located (buried) in the recess 47 has a rounded circumferential edge. The surface of the plating layer 46 of each of the IC-chip connection terminals 41 and the capacitor connection terminals 42 is exposed through the opening 35 or 36.

In the present embodiment, the IC-chip connection terminals 41 and the capacitor connection terminals 42 are present at the interface between the solder resist layer 25 and the resin insulation layer 23, and a wiring pattern of the conductive layer 26 is formed at the same interface. As in the case of the connection terminals 41 and 42, the conductive layer 26 is also embedded (buried) in the outermost resin insulation layer 23.

On the bottom surface 32 side of the wiring laminate portion 30, the surface of the outermost resin insulation layer 21 is covered substantially completely by a solder resist layer 28. The solder resist layer 28 has openings 37 formed therein so as to expose the motherboard connection terminals 45. The solder resist layer 28 is formed primarily of a hardened photocurable resin material. Each of the motherboard connection terminals 45 is mainly constituted by a copper layer 44, and has a diameter greater than that of the openings 37. A main-surface-side circumferential portion of the copper layer 44 of each motherboard connection terminal 45 is covered by the solder resist layer 28. A plating layer 48 formed of a metal other than copper (specifically, a nickel plating layer 48a and a gold plating layer 48b) is formed at a central portion of the copper layer 44 exposed through the corresponding opening 37. A motherboard is connected to the motherboard connection terminals 45 via unillustrated solder bumps formed thereon.

In the multilayer wiring substrate 10, not only the motherboard connection terminals 45, but also the conductive layer 26 which forms a wiring pattern are formed at the interface between the resin simulation layer 21 and the solder resist layer 28. As in the case of the motherboard connection terminals 45, the conductive layer 26 is also embedded (buried) in the solder resist layer 28.

The thus-configured multilayer wiring substrate 10 is fabricated by, for example, the following procedure.

First, a support substrate (a glass epoxy substrate or the like) having sufficient strength is prepared. On the support substrate, the resin insulation layers 21 to 23 and the conductive layers 26 are alternately built up, thereby forming the wiring laminate portion 30.

Figure 5:
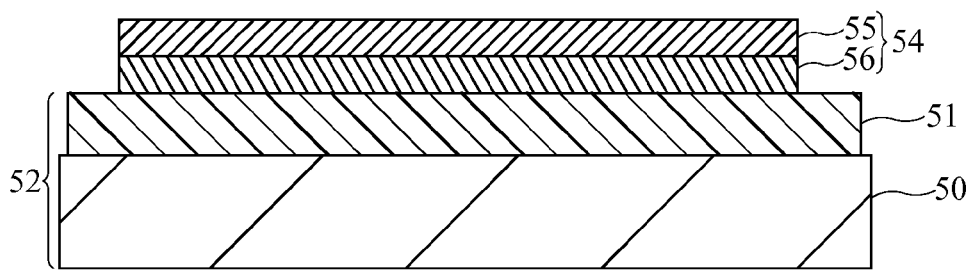
FIG. 5 is an explanatory view showing a method of manufacturing the multilayer wiring substrate according to the first embodiment.

More specifically, as shown in FIG. 5, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51. Then, a metal laminate sheet 54 is disposed on the upper surface of the ground resin insulation layer 51 of the base material 52. Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 (a pair of metal foils) are separably in close contact with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 6:
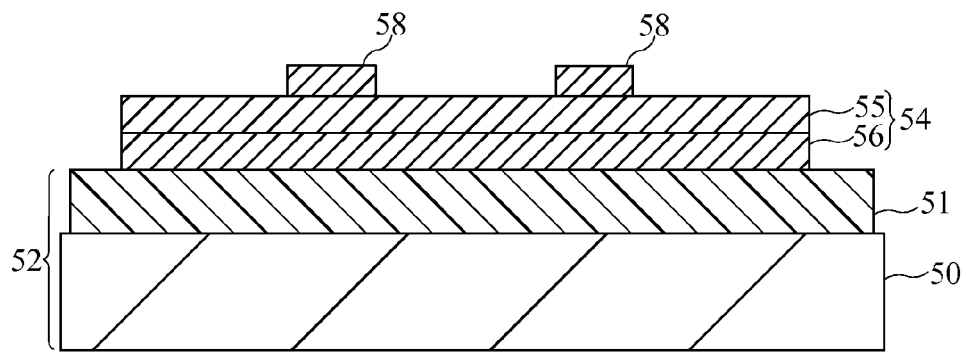
FIG. 6 is an explanatory view showing the method of manufacturing the multilayer wiring substrate according to the first embodiment.

Next, a metal layer forming step is performed. Specifically, a dry film for forming a plating resist layer is laminated on the upper surface of the metal laminate sheet 54, and exposure and development are carried out for the dry film. As a result, there is formed a plating resist layer of a predetermined pattern, which has openings at positions corresponding to the connection terminals 41 and 42. Furthermore, copper electroplating is selectively performed with the plating resist layer formed, whereby metal conductor portions 58 are formed on the metal laminate sheet 54. The plating resist layer is then peeled off (see FIG. 6). Furthermore, in order to enhance adhesion between the metal conductor portions 58 and the corresponding resin insulation layer, the surfaces of the metal conductor portions 58 are roughened (treatment performed by use of a CZ-series etching agent available from MEC Co., Ltd.).

After that, a sheet-like resin insulation layer 25 (a resin insulation layer which will later becomes the solder resist film 25) is disposed on and attached onto the base material 52 in such a manner as to cover the metal laminate sheet 54, on which the metal conductor portions 58 have been formed.

This resin insulation layer 25 comes into close contact with the metal laminate sheet 54 and the metal conductor portions 58, and comes into close contact with the ground resin insulation layer 51 in a region around the metal laminate sheet 54, thereby sealing in the metal laminate sheet 54.

Figure 7:
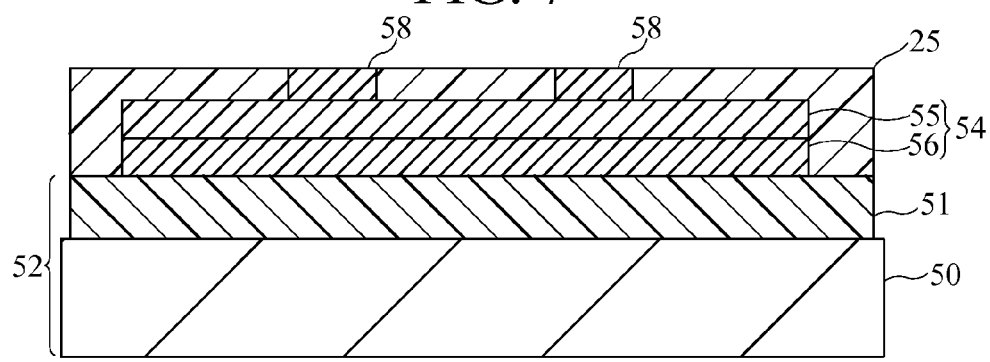
FIG. 7 is an explanatory view showing the method of manufacturing the multilayer wiring substrate according to the first embodiment.

Subsequently, as shown in FIG. 7, the upper end surfaces of the metal conductor portions 58 are exposed from the resin insulation layer 25 by means of performing, for example, buffing. After that, by use of etchant, such as a potassium permanganate solution, a desmear step is performed for removing smears on the metal conductor portions 58. After the desmear step, gold electroplating and nickel electroplating are performed so as to form plating portions on the upper end surfaces of the metal conductor portions 58 exposed from the resin insulation layer 25. The plating portions will become the plating layers 46 of the connection terminals 41 and 42. Each of the plating portions includes the gold plating layer 46b, which is formed to cover the upper end surface of the corresponding metal conductor portion 58, and the nickel plating layer 46a, which is formed to cover the gold plating layer 46b. The plating portions rise from the upper end surfaces of the metal conductor portion 58.

Figure 8:
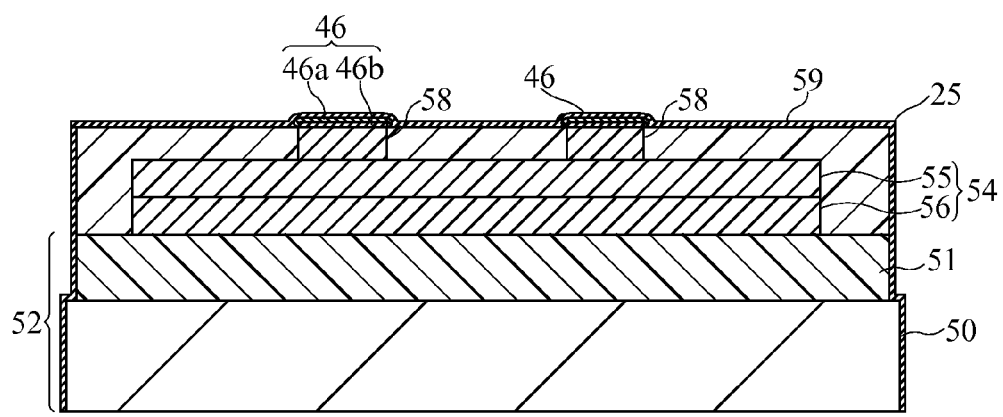
FIG. 8 is an explanatory view showing the method of manufacturing the multilayer wiring substrate according to the first embodiment.

Specifically, electroless copper plating is performed so as to form an electroless plating layer 59 which covers the resin insulation layer 25 and the plating layers 46 on the metal conductor portions 58 (see FIG. 8). Subsequently, a dry film for forming a plating resist layer is laminated on the upper surface of the resin insulation layer 25, and exposure and development are carried out for the dry film. As a result, there is formed a plating resist layer of a predetermined pattern, which has openings at positions corresponding to the connection terminals 41 and 42 and the conductive layers 26. Furthermore, copper electroplating is selectively performed with the plating resist layer formed, to thereby form within the openings copper plating portions which will become the copper layers 44 and the conductive layers 26. The plating resist layer is then peeled off.

Furthermore, etching is performed so as to partially remove exposed portions of the electroless plating layer 59 on the surface of the resin insulation layer 25. As a result, the copper layers 44 of the connection terminals 41 and 42 are formed such that they cover the plating layers 46, and the conductive layers 26 are formed (copper layer forming step).

Figure 9:
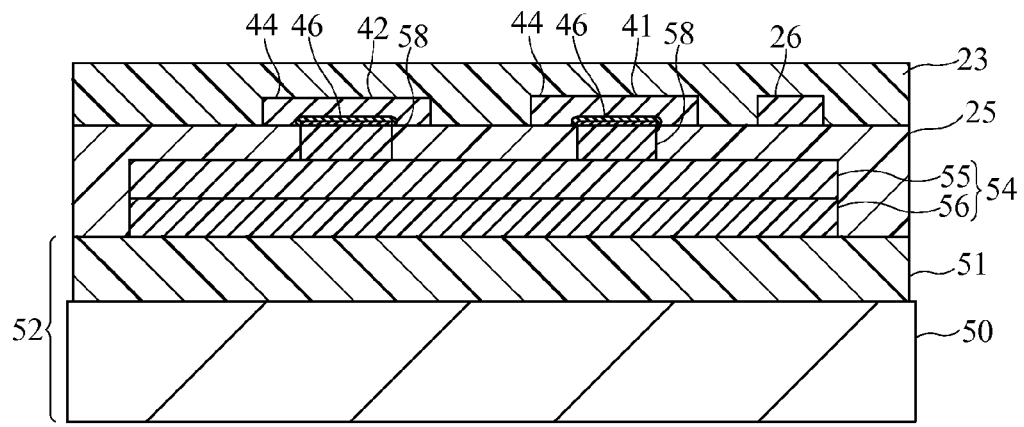
FIG. 9 is an explanatory view showing the method of manufacturing the multilayer wiring substrate according to the first embodiment.

After the copper layer forming step, a build-up step is performed. In the build-up step, the sheet-like resin insulation layer 23 is first disposed on and attached onto the resin insulation layer 25, on which the copper layers 44 and the conductive layers 26 have been formed (see FIG. 9). The via holes 33 are formed in the resin insulation layer 23 at predetermined positions (positions above the connection terminals 41) by means of performing laser beam machining by use of, for example, an excimer laser, a UV laser, or a $CO_2$ laser. Next, by use of etchant, such as a potassium permanganate solution, a desmear step is performed for removing smears from inside the via holes 33. In the desmear step, in place of treatment by use of etchant, plasma ashing by use of, for example, $O_2$ plasma may be performed.

After the desmear step, electroless copper plating and copper electroplating are performed by a known process, thereby forming the via conductors 34 in the via holes 33. Further, etching is performed by a known process (e.g., semi-additive process), thereby forming the conductive layer 26 in a predetermined pattern on the resin insulation layer 23.

Figure 10:
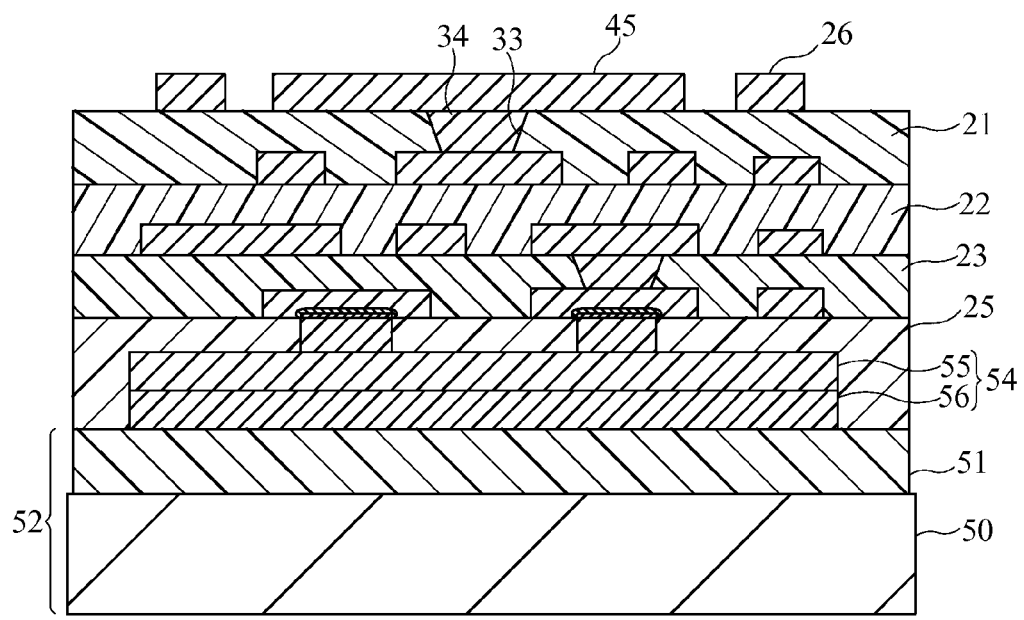
FIG. 10 is an explanatory view showing the method of manufacturing the multilayer wiring substrate according to the first embodiment.

Also, other resin insulation layers 22 and 21 and the corresponding conductive layers 26 are formed and laminated on the resin insulation layer 23 by processes similar to those used to form the resin insulation layer 23 and the associated conductive layer 26. Subsequently, the motherboard connection terminals 45 and the corresponding conductive layer 26 are formed on the outermost resin layer 21 (see FIG. 10).

Furthermore, photosensitive epoxy resin is applied onto the outermost resin layer 21 and is cured so as to form a solder resist layer 28. Exposure and development are then performed with a predetermined mask placed thereon so as to form openings 37 in the solder resist layer 28. As a result, central portions of the motherboard connection terminals 45 are exposed from the openings 37 of the solder resist layer 28. The surface of the conductive layer 26 is covered by the solder resist layer 28. After that, electroless nickel plating and electroless gold plating are successively performed on the surfaces of the motherboard connection terminals 45 exposed from the openings 37. Thus, the plating layer 48 composed of the nickel plating layer 48a and the gold plating layer 48b is formed on each of the motherboard connection terminals 45 (see FIG. 11).

Figure 11:
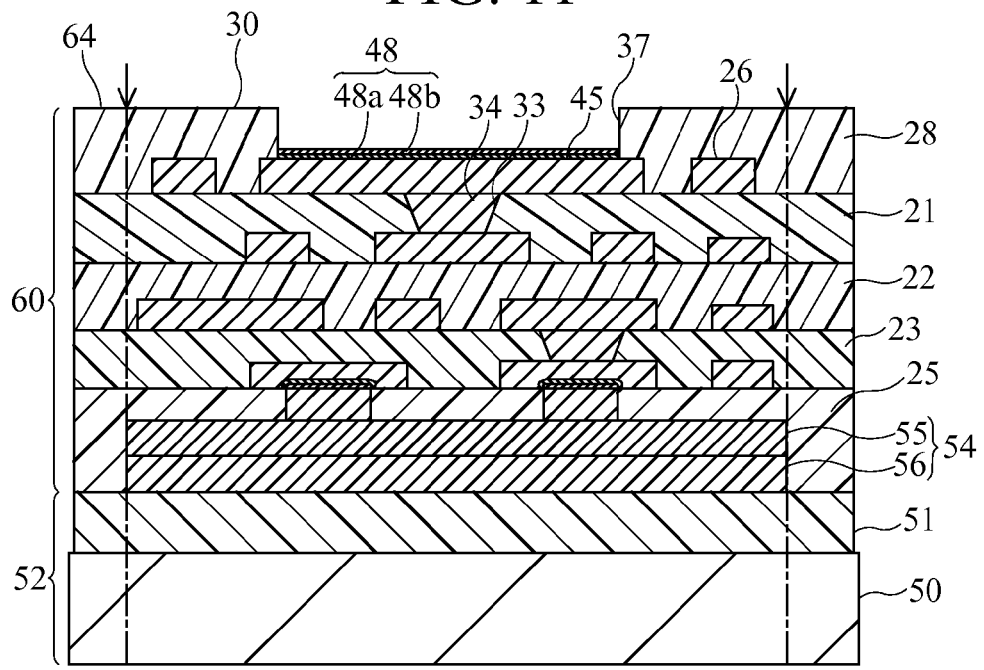
FIG. 11 is an explanatory view showing the method of manufacturing the multilayer wiring substrate according to the first embodiment.

By the above-described build-up step, there is formed a wiring laminate 60 in which the metal laminate sheet 54, the resin insulation layers 21 to 23 and 25, and the conductive layers 26 are laminated on the base material 52. Notably, as shown in FIG. 11, a portion of the wiring laminate 60 which is located above the metal laminate sheet 54 will become the wiring laminate portion 30 of the multilayer wiring substrate 10.

After the build-up step, the wiring laminate 60 is cut by a dicing apparatus (not shown) so as to remove a surrounding portion around the wiring laminate portion 30. At this time, as shown in FIG. 11, cutting progresses along the boundary (indicated by the arrows in FIG. 11) between the wiring laminate portion 30 and a surrounding portion 64 and along the extension of the boundary for further cutting of the base material 52 (the support substrate 50 and the ground resin insulation layer 51) located under the wiring laminate portion 30. As a result of this cutting, a peripheral edge portion of the metal laminate sheet 54 which has been sealed in the resin insulation layer 25 is exposed. That is, as a result of removal of the surrounding portion 64, a bonded portion between the ground resin insulation layer 51 and the resin insulation layer 25 is lost. Consequently, the wiring laminate portion 30 and the base material 52 are connected together merely through the metal laminate sheet 54.

Figure 12:
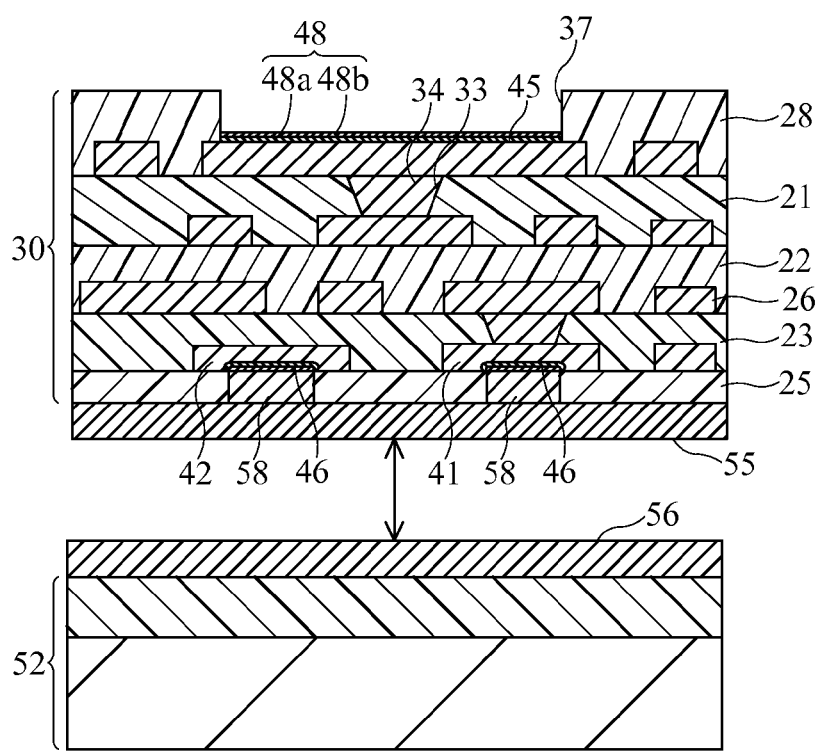
FIG. 12 is an explanatory view showing the method of manufacturing the multilayer wiring substrate according to the first embodiment.

As shown in FIG. 12, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface of the wiring laminate portion 30 (the resin insulation layer 25). Furthermore, on the bottom surface side of the wiring laminate portion 30, the exposed copper foil 55 and the metal conductor portions 58 are removed through etching (base-material removing step).

Specifically, a dry film for forming an etching resist layer is laminated on the top surface of the wiring laminate portion 30, and exposure and development are performed for the dry film to thereby form an etching resist layer which covers the entirety of the top surface. In this state, etching is performed for the wiring laminate portion 30 so as to remove the entire copper foil 55 and remove the metal conductor portions 58. After the etching, the etching resist layer formed on the top surface of the wiring laminate portion 30 is removed. As a result, the openings 35 and 36 are formed in the resin insulation layer 25, and the surfaces of the IC-chip connection terminals 41 and the capacitor connection terminals 42 (the surfaces of the plating layers 46) are exposed through the openings 35 and 36. Notably, at that time, since the plating layers 46 (specifically, the gold plating layer 46b located on the surface side) of the connection terminals 41 and 42 are lower in etching rate than copper, each of the plating layers 46 serves as an etching stop layer, and remains within the openings 35 and 36.

The multilayer wiring substrate 10 of FIG. 1 is manufactured through the above-described steps.

Therefore, the present embodiment can yield the following effects.

(1) In the multilayer wiring substrate 10 of the present embodiment, the solder resist layer 25 having the plurality of opening 35 and 36 is disposed on the top surface 31 of the wiring laminate portion 30, and the plurality of IC-chip connection terminals 41 and the plurality of capacitor connection terminals 42 are embedded (buried) in the outermost resin insulation layer 23 in contact with the solder resist layer 25. Each of the connection terminals 41 and 42 is composed of the copper layer 44 (main portion) and the plating layer 46 made of two types of metal other than copper, and the main-surface-side circumferential portion 44a of the copper layer 44 is covered by the solder resist layer 25. In this configuration, unlike conventional multilayer wiring substrates, since no gold plating layer is present at the interface between the solder resist layer 25 and the copper layer 44, a clearance is not formed between the solder resist layer 25 and a circumferential portion of each terminal during solder connection. Therefore, the adhesion strength between the solder resist layer 25 and each of the connection terminals 41 and 42 can be increased sufficiently. Furthermore, since the plating layer 46 is provided such that it is located (buried) in the recess 47 present at the main-surface-side central portion 44b of the copper layer 44, the thickness of the connection terminals 41 and 42 can be reduced. Moreover, since the connection terminals 41 and 42 are configured such that the plating layer 46 does not project from the surface of the copper layer 44, the depth of the openings 35 and 36 of the solder resist layer 25 can be secured sufficiently. In this case, as compared with the case where the plating layer 46 projects from the surface of the copper layer 44, the thickness of the solder resist layer 25 can be reduced, whereby the thickness of the multilayer wiring substrate 10 can be reduced.

(2) In the multilayer wiring substrate 10 of the present embodiment, in addition to the plurality of IC-chip connection terminals 41 and the plurality of capacitor connection terminals 42, the conductive layer 26, which forms a wiring pattern, is present at the interface between the solder resist layer 25 and the outermost resin insulation layer 23. This conductive layer 26 is embedded (buried) in the resin insulation layer 23 as in the case of the connection terminals 41 and 42. By virtue of this configuration, a sufficient degree of insulation can be secured between the conductive layers 26 forming wiring patterns and between the conductive layers 26 and the connection terminals 41 and 42. Accordingly, since wiring traces can be provided at a relatively narrow pitch, the degree of integration of the multilayer wiring substrate 10 can be increased.

(3) In the present embodiment, the recess 47 present at the main-surface-side central portion 44b of the copper layer 44 is formed such that it is narrow at the inlet and becomes wider at the inside thereof. In this case, the area of contact between the copper layer 44 and the plating layer 46 can be increased, whereby the plating layer 46 can be provided with a sufficient degree of strength. Accordingly, the strength of the connection terminals 41 and 42 can be increased, and the reliability of the multilayer wiring substrate 10 can be enhanced.

(4) In the multilayer wiring substrate 10 of the present embodiment, the solder resist layer 28 having the plurality of openings 37 is disposed on the bottom surface 32 of the wiring laminate portion 30, and the plurality of motherboard connection terminals 45 are provided at positions corresponding to the openings 37 of the solder resist layer 28. In the case of the motherboard connection terminals 45 as well, the main-surface-side circumferential portion of the copper layer 44 (main body) is covered by the solder resist layer 28. In the case of the motherboard connection terminals 45 as well, no gold plating layer is present at the interface between the solder resist layer 28 and the copper layer 44. Therefore, a clearance is not formed between the solder resist layer 28 and a circumferential portion of each terminal during solder connection, and the adhesion strength of the connection terminals 45 can be increased sufficiently.

Second Embodiment

Figure 13:
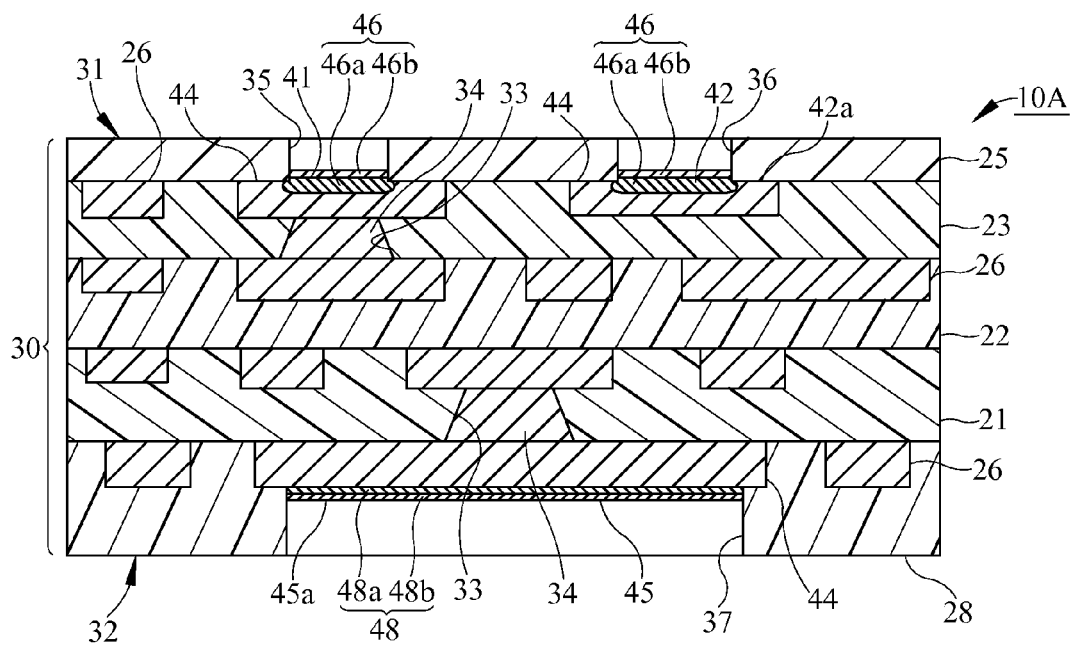
FIG. 13 is an enlarged sectional view schematically showing the structure of a multilayer wiring substrate according to a second embodiment.

Next, a second embodiment of the present invention will be described with reference to the drawings. As shown in FIG. 13, a multilayer wiring substrate 10A of the present embodiment differs from the multilayer wiring substrate of the first embodiment in the structure of the plating layers 46 of the IC-chip connection terminals 41 and the capacitor connection terminals 42 formed on the top surface 31 side of the wiring laminate portion 30, as well as in the method of manufacturing the multilayer wiring substrate. In the below, the difference from the first embodiment will be mainly described.

Figure 14:
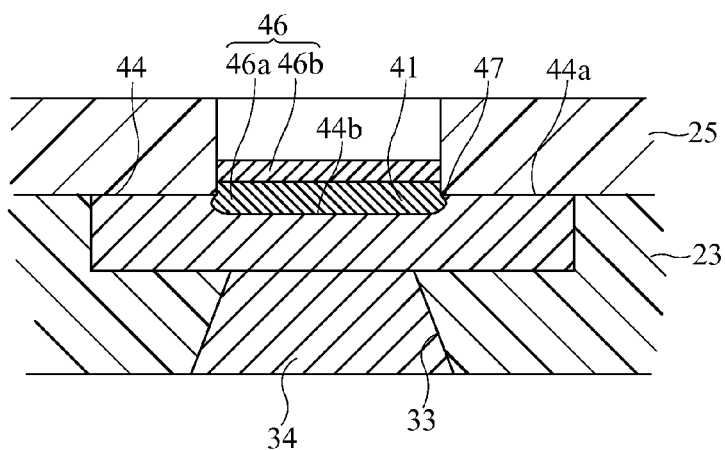
FIG. 14 is an enlarged sectional view showing the structure of an IC-chip connection terminal according to the second embodiment.

As shown in FIGS. 13 and 14, the IC-chip connection terminals 41 and the capacitor connection terminals 42 are configured such that a portion of the plating layer 46 is located (buried) in the copper layer 44. In the present embodiment as well, the plating layer 46 is composed of the nickel plating layer 46a and the gold plating layer 46b, and a portion of the nickel plating layer 46a is provided within the recess 47 formed at the main-surface-side central portion 44b of the copper layer 44. Further, within the opening 35, 36, the gold plating layer 46b is provided on the surface of the nickel plating layer 46a projecting from the recess 47 of the copper layer 44. Notably, the structures of various portions of the multilayer wiring substrate 10A (the motherboard connection terminals 45, the conductive layers 26, the resin insulation layers 21 to 23, etc.), excluding the IC-chip connection terminals 41 and the capacitor connection terminals 42, are identical with those of the multilayer wiring substrate 10 according to the first embodiment.

The multilayer wiring substrate 10A of the present embodiment is fabricated by the following procedure.

First, through performance of steps similar to those of the first embodiment, as shown in FIG. 7, the sheet-like resin insulation layer 25 is disposed on and attached onto the base material 52 in such a manner as to cover the metal laminate sheet 54, on which the metal conductor portions 58 have been formed. The upper end surfaces of the metal conductor portions 58 are then exposed from the resin insulation layer 25 by means of performing buffing. After that, nickel electroplating is performed so as to form the nickel plating layers 46a on the upper end surfaces of the metal conductor portions 58 exposed from the resin insulation layer 25.

Next, electroless copper plating is performed so as to form the electroless plating layer 59, which covers the resin insulation layer 25 and the nickel plating layers 46a on the metal conductor portions 58. Subsequently, a dry film for forming a plating resist layer is laminated on the upper surface of the resin insulation layer 25, and exposure and development are carried out for the dry film. As a result, there is formed a plating resist layer of a predetermined pattern, which has openings at positions corresponding to the connection terminals 41 and 42 and the conductive layers 26. Furthermore, copper electroplating is selectively performed with the plating resist layer formed, to thereby form copper plating portions which will become the copper layers 44 and the conductive layers 26. The plating resist layer is then peeled off.

Furthermore, etching is performed so as to partially remove exposed portions of the electroless plating layer 59 on the surface of the resin insulation layer 25. As a result, the copper layers 44 of the connection terminals 41 and 42 are formed such that they cover the nickel plating layers 46a, and the conductive layers 26 are formed (copper layer forming step).

After that, by performing a build-up step in the same manner as in the case of the first embodiment, there is formed the wiring laminate 60, in which the metal laminate sheet 54, the resin insulation layers 21 to 23 and 25, and the conductive layers 26 are laminated on the base material 52. Furthermore, the wiring laminate 60 is cut by a dicing apparatus so as to remove a surrounding portion around the wiring laminate portion 30.

The wiring laminate portion 30 and the base material 52 are then separated from each other at the interface between the copper foils 55 and 56 of the metal laminate sheet 54, thereby removing the base material 52 from the wiring laminate portion 30 and exposing the copper foil 55 present on the bottom surface of the wiring laminate portion 30 (the resin insulation layer 25). Furthermore, on the bottom surface side of the wiring laminate portion 30, the exposed copper foil 55 and the metal conductor portions 58 are removed through etching. As a result, the openings 35 and 36 are formed in the resin insulation layer 25, and the surfaces of the nickel plating layers 46a are exposed through the openings 35 and 36. Notably, at that time, since the nickel plating layers 46a are lower in etching rate than copper, each of the nickel plating layers 46a serves as an etching stop layer, and remains within the openings 35 and 36.

After that, photosensitive epoxy resin is applied onto the outermost resin layer 21 and is cured so as to form the solder resist layer 28. Exposure and development are then performed with a predetermined mask placed thereon so as to form the openings 37 in the solder resist layer 28. As a result, central portions of the motherboard connection terminals 45 are exposed from the openings 37 of the solder resist layer 28. The surface of the conductive layer 26 is covered by the solder resist layer 28.

After that, electroless nickel plating and electroless gold plating are successively performed on the surfaces of the nickel plating layers 46a of the IC-chip connection terminals 41 exposed from the openings 35, on the surfaces of the nickel plating layers 46a of the capacitor connection terminals 42 exposed from the openings 36, and on the surfaces of the motherboard connection terminals 45 exposed from the openings 37. In the case of the IC-chip connection terminals 41 and the capacitor connection terminals 42, electroless nickel plating is performed on the nickel plating layer 46a within the recess 47 of the copper layer 44. As a result, the nickel plating layer 46a is formed within the opening 35, 36 such that the nickel plating layer 46a projects from the recess 47 of the copper layer 44. Further, the gold plating layer 46b is formed to cover the nickel plating layer 46a. In the case of the motherboard connection terminals 45, the nickel plating layer 48a and the gold plating layer 48b are formed on the surface of the center portion of each terminal exposed within the opening 37. Through the above-described steps, the multilayer wiring substrate 10A of FIG. 13 is fabricated.

Even in the multilayer wiring substrate 10A of the present embodiment, effects similar to those of the first embodiment can be obtained. Furthermore, in the multilayer wiring substrate 10A, since the plating layer 46 of each of the connection terminals 41 and 42 projects into the opening 35, 36, the adhesion area between the plating layer 46 and the solder resist layer 25 increases. Accordingly, stresses acting at the boundaries between the connection terminals 41 and 42 and the solder resist layer 25 can be suppressed.

Notably, the embodiments of the present invention may be modified as follows.

Figure 15:
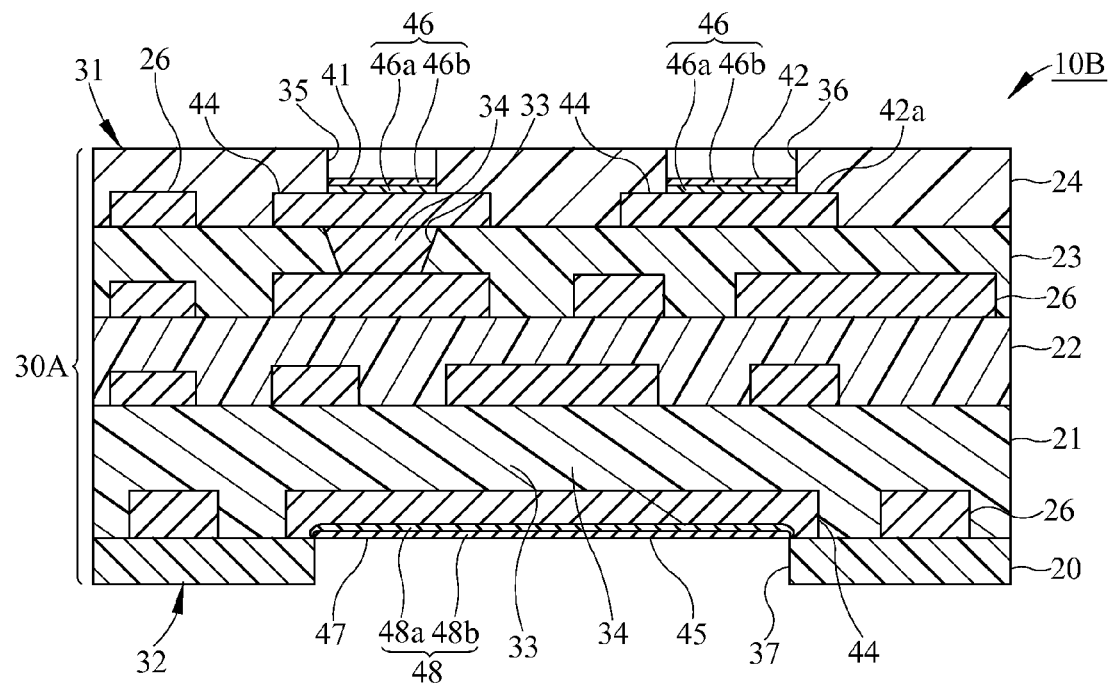
FIG. 15 is an enlarged sectional view schematically showing the structure of a multilayer wiring substrate according to another embodiment.
Figure 16:
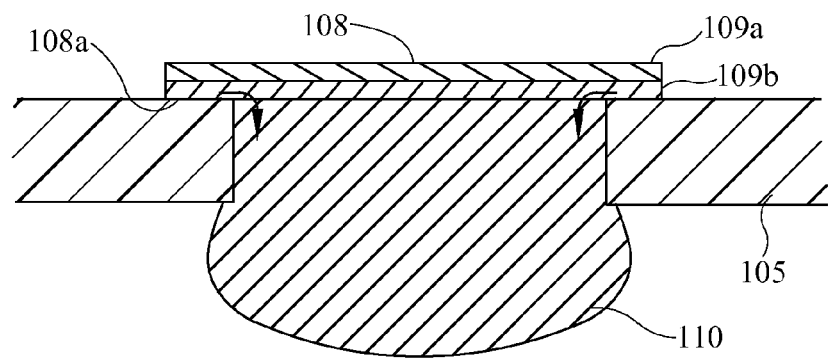
FIG. 16 is an enlarged sectional view showing a conventional wiring substrate.

In the above-described embodiments, the multilayer wiring substrate 10, 10A is fabricated by stacking the resin insulation layer 21 to 23 and the conductive layers 26 from the top surface 31 (first main surface) side where the IC-chip connection terminals 41 and the capacitor connection terminals 42 are formed. However, the present invention is not limited thereto. The multilayer wiring substrate may be fabricated by stacking the resin insulation layer 21 to 23 and the conductive layers 26 from the bottom surface 32 (second main surface) side where the motherboard connection terminals 45 are formed. FIG. 15 shows a multilayer wiring substrate 10B in which stacking is performed from the bottom surface 32 (second main surface) side.

The multilayer wiring substrate 10B of FIG. 15 has a multilayer wiring laminate portion 30A (laminate structure) in which the resin insulation layers 20, 21, 22, 23, and 24 made primarily of the same resin insulation material, and the conductive layers 26 made of copper are laminated alternately. In the multilayer wiring substrate 10B, the resin insulation layer 20 covering the bottom surface 32 of the wiring laminate portion 30A, and the resin insulation layer 24 covering the top surface 31 thereof function as solder resist layers. The resin insulation layer 20 has the plurality of opening 37 formed therein so as to expose the motherboard connection terminals 45. The resin insulation layer 24 has the plurality of opening 35 and 36 formed therein so as to expose the IC-chip connection terminals 41 and the capacitor connection terminals 42. The IC-chip connection terminals 41 and the capacitor connection terminals 42 of the wiring laminate portion 30A are configured such that the plating layer 46 (the nickel plating layer 46a and the gold plating layer 46b) is formed on the surface of each terminal exposed from the opening 35, 36.

Moreover, each of the motherboard connection terminals 45 of the wiring laminate portion 30A is configured such that the recess 47 is present at the main-surface-side central portion 44b of the copper layer 44 (main body), and the plating layer 48 (the nickel plating layer 48a and the gold plating layer 48b) is provided such that it is located (buried) in the recess 47. In the wiring laminate portion 30A, the plurality of conductive layers 26 formed in the resin insulation layers 20 to 24 are connected with one another via conductors 34 shaped such that their diameters increase in the direction from the bottom surface 32 toward the top surface 31.

Even in the multilayer wiring substrate 10B of FIG. 15, since no gold plating layer is present between the resin insulation layer 20 serving as a solder resist layer and the copper layer 44 of each motherboard connection terminal 45, the adhesion strength between the resin insulation layer 20 and each of the motherboard connection terminals 45 can be secured sufficiently. Furthermore, in each of the motherboard connection terminals 45, the plating layer 48 is provided such that it is located (buried) in the recess 47 of the copper layer 44. Therefore, the thickness of the motherboard connection terminals 45 can be reduced.

In the above-described embodiments, each of the plating layers 46 and 48 covering the connection terminals 41, 42, and 45 is a nickel-gold plating layer. However, any plating layer may be used so long as the plating layer is made of metal other than copper. For example, the nickel-gold plating layer may be replaced with any other plating layer such as a nickel-palladium-gold plating layer.

Next, technical ideas that the embodiments described above implement are enumerated below.

(1) The multilayer wiring substrate of Means 1 is characterized in that each of the via conductors formed in the plurality of resin insulation layers is shaped such that its diameter increases in the direction from the first main surface side toward the second main surface side.

(2) The multilayer wiring substrate of Means 1 is characterized in that the solder resist layer and the outermost resin insulation layer are made primarily of the same resin insulation material.

(3) The multilayer wiring substrate of Means 1 is characterized in that a plurality of first-main-surface-side connection terminals or a plurality of second-main-surface-side connection terminals are present at the interface between the solder resist layer and the outermost resin insulation layer, and the corresponding conductive layer is present at the same interface as the connection terminals.

(4) The multilayer wiring substrate according to any one of Means 1 to 4 is characterized in that the solder resist layer is disposed on the first main surface side of the laminate structure, and, on the first main surface side, two types of connection terminals (i.e., IC-chip connection terminals to which an IC chip is to be connected, and passive-component connection terminals to which a passive component is to be connected and which is greater in area than the IC-chip connection terminals) are present as the plurality of first-main-surface-side connection terminals.

DESCRIPTION OF REFERENCE NUMERALS 10, 10A, 10B: multilayer wiring substrate
20: resin insulation layer serving as a solder resist layer
21 to 23: resin insulation layer
25: solder resist layer
26: conductive layer
30, 30A: wiring laminate portion serving as a laminate structure
31: top surface serving as a first main surface
32: bottom surface serving as a second main surface
34: via conductor
35, 36, 37: opening
41: IC-chip connection terminal serving as a first-main-surface-side connection terminal
42: capacitor connection terminal serving as a first-main-surface-side connection terminal
44: copper layer
44a: main-surface-side peripheral portion
44b: main-surface-side central portion
45: motherboard connection terminal serving as a second-main-surface-side connection terminal
46, 48: plating layer as a metallic layer
46a, 48a: nickel plating layer as a nickel layer
46b, 48b: gold plating layer as a gold layer
47: recess

What is claimed is:

1. A multilayer wiring substrate comprising a laminate structure in which a plurality of resin insulation layers made primarily of a same resin insulation material, and a plurality of conductive layers are laminated alternately, a plurality of first-main-surface-side connection terminals being disposed on a first main surface side of the laminate structure, a plurality of second-main-surface-side connection terminals being disposed on a second main surface side of the laminate structure, the plurality of conductive layers being formed in the plurality of resin insulation layers and interconnected by means of via conductors whose diameters increase toward the first main surface side or the second main surface side, wherein:
- either the plurality of first-main-surface-side connection terminals or the plurality of second-main-surface-side connection terminals comprises a copper layer and a metallic layer formed of at least one type of metal other than copper, and is embedded in an outermost resin insulation layer;
- a solder resist layer having a plurality of openings is disposed on the outermost resin insulation layer;
- a main-surface-side circumferential portion of the copper layer is covered by the solder resist layer;
- at least a portion of the metallic layer is located in a recess in a main-surface-side central portion of the copper layer, the recess being formed such that it is narrow at an inlet and becomes wider at an inside thereof; and
- at least a portion of the metallic layer is exposed via a corresponding opening of the plurality of openings of the solder resist layer.

2. A multilayer wiring substrate according to claim 1, wherein a conductive layer present at an interface between the solder resist layer and the outermost resin insulation layer is embedded in the outermost resin insulation layer.

3. A multilayer wiring substrate according to claim 1, wherein the metallic layer includes a nickel layer and a gold layer.

4. A multilayer wiring substrate according to claim 1, wherein the diameters of the via conductors increase in a direction from the first main surface side toward the second main surface side.

5. A multilayer wiring substrate according to claim 1, wherein the solder resist layer and the outermost resin insulation layer are made primarily of the same resin insulation material.

6. A multilayer wiring substrate according to claim 1, wherein the respective plurality of first-main-surface-side connection terminals or plurality of second-main-surface-side connection terminals, and a corresponding conductive layer are present at an interface between the solder resist layer and the outermost resin insulation layer.

7. A multilayer wiring substrate according to claim 1, wherein the solder resist layer is disposed on the first main surface side of the laminate structure, and, the first-main-surface-side connection terminals comprise IC-chip connection terminals to which an IC chip is to be connected, and passive-component connection terminals to which a passive component is to be connected and which are greater in area than the IC-chip connection terminals.

* * * * *

UNITED STATES PATENT AND TRADEMARK OFFICE
CERTIFICATE OF CORRECTION

PATENT NO. : 8,658,905 B2  Page 1 of 1
APPLICATION NO. : 13/070094
DATED : February 25, 2014
INVENTOR(S) : Maeda et al.

It is certified that error appears in the above-identified patent and that said Letters Patent is hereby corrected as shown below:

IN THE CLAIMS:

In claim 1, col. 15, line 9: delete "comprises" and replace with "comprise"

Signed and Sealed this
Third Day of June, 2014

Michelle K. Lee
*Deputy Director of the United States Patent and Trademark Office*